United States Patent [19]

Bonhomme

[11] 4,179,724

[45] Dec. 18, 1979

[54] CABINETS FOR ELECTRICAL OR ELECTRONIC EQUIPMENT

[76] Inventor: François R. Bonhomme, 6, Parc de Bearn, 92210 Saint Cloud, France

[21] Appl. No.: 829,440

[22] Filed: Aug. 31, 1977

Related U.S. Application Data

[63] Continuation-in-part of Ser. No. 779,302, Mar. 21, 1977.

[30] Foreign Application Priority Data

Apr. 2, 1976 [FR] France ................................ 76 09571

[51] Int. Cl.$^2$ ................................................ H02B 1/02

[52] U.S. Cl. ...................................... 361/391; 361/415

[58] Field of Search ........................ 361/415, 391, 399; 339/65, 17 L, 17 LC, 17 M, 17 LM

[56] References Cited

U.S. PATENT DOCUMENTS

| | | | |
|---|---|---|---|
| 3,328,646 | 6/1967 | Caillat | 361/415 |
| 3,344,243 | 9/1967 | De Vries | 361/415 |
| 3,368,115 | 2/1968 | Hoffman | 361/415 |
| 3,576,515 | 4/1971 | Frantz | 361/391 |

FOREIGN PATENT DOCUMENTS

| | | | |
|---|---|---|---|
| 2131527 | 12/1972 | Fed. Rep. of Germany | 361/415 |

*Primary Examiner*—David Smith, Jr.

*Attorney, Agent, or Firm*—John A. Young

[57] ABSTRACT

In a cabinet for electrical or electronic equipment, of the type in which the components of the equipment are mounted on vertically disposed printed circuit boards carried by supports movable on slides within a metal casing so that the supports can be easily withdrawn from the casing, the usual rigid drawer forming the support is replaced by a horizontally disposed printed circuit board movable in slides in the casing which also form connectors making electrical connection with conducting tracks on the horizontal printed circuit board. The horizontal board also carries a set of similar connectors to receive the vertically disposed printed circuit boards. The connectors are of the type whose contacts can be held open during insertion or extraction of a printed circuit board so that zero force is required for insertion or extraction.

9 Claims, 4 Drawing Figures

CABINETS FOR ELECTRICAL OR ELECTRONIC EQUIPMENT

RELATED APPLICATIONS

This application is a continuation-in-part of application Ser. No. 779,302, filed March 21, 1977.

BACKGROUND OF THE INVENTION

1. Field of the Invention

This invention relates to cabinets for electrical or electronic equipment.

More particularly, the invention relates to bay-mounted cabinets, these cabinets also being known as "wiring cubicles."

2. Description of the Prior Art

As is known, bay mounting is a mode of construction wherein the component members of electrical or electronic equipment are mounted on printed circuit boards carried by supports, called "drawers" or "baskets," which can slide on rails or slides inside a metal casing. Each drawer is equipped with one or more electrical connectors, each affording a fairly large number of connections. The various elements of the device are easily accessible when the drawers are extracted from the casing.

As will be explained in more detail hereinafter, the wiring cubicles hitherto known are complicated in construction and consequently inconvenient, particularly because of the difficulties which they place in the way of wiring operations, and they only have a limited number of connections for the printed circuit boards which they contain.

SUMMARY OF THE INVENTION

An object of the invention is to provide a wiring cubicle which meets practical requirements better than hitherto and which, in particular, overcomes the disadvantages indicated above.

According to this invention there is provided a cabinet for electrical or electronic equipment, comprising a casing, a plurality of supports movable on horizontal slides carried by lateral walls of the casing, the supports comprising sets of further slides arranged in pairs in such a manner that each pair of said further slides can receive a vertically disposed printed circuit board, wherein at least one horizontal wall of each support consists of a horizontally disposed printed circuit board carrying one of the said sets of slides and having lateral edges engaging the slides carried by the casing, and wherein each of the slides carried by the lateral walls of the casing and of the slides carried by the or each horizontally disposed printed circuit board comprises a connector adapted to receive a peripheral portion of a printed circuit board and having contact members adapted to engage respective conducting tracks on the peripheral portion of the printed circuit board and means for ensuring that the contact members are open during insertion into or extraction from the connector of a printed circuit board, the arrangement being such that each of the connectors forming the slides carried by the horizontally disposed printed circuit board can make electrical contact with conducting tracks formed on the peripheral portion adjacent that horizontal side of the vertically disposed printed circuit board which engages the slide, and the connectors forming the slides carried by the casing can make electrical contact with conducting tracks formed on the horizontally disposed printed circuit board on the peripheral portions adjacent said lateral edges, the connectors forming the slides on the horizontally disposed printed circuit board being electrically connected to the conducting tracks on that board.

The said connectors are "zero insertion force connectors," by which is meant connectors equipped with a mechanism which opens its contact members or allows them to open, just before and during the introduction of any printed circuit board into the connector, and just before and during the extraction of such a board from the connector, that is to say to remove the active regions of the contact members from the volume swept by this board in such a manner as to render zero the force necessary for the introduction or for the extraction of the board and to protect the protective coverings both of the contact members and of the connecting tracks of the boards from any wear by friction. Once the board has arrived in its working position, the mechanism in question closes the contact members or allows them to close, that is to say causes them to bear resiliently, through their active regions, on the corresponding connecting tracks of the board, which tracks are generally provided on both faces of the board. Such zero insertion force connectors can be classified in three main categories: that where the above-mentioned mechanism acts in the sense of opening the contact members leaving these to close under the effect of their own resilience; that where the mechanism in question acts in the sense of closing the contact members leaving these to open under the effect of their own resilience; and finally that where this mechanism acts alternately in the sense of opening and of closing the contact members. The first two categories are familiar to those skilled in the art of printed circuit boards; as for the third category, it is illustrated, in particular, in co-pending application Ser. No. 665,864 filed Mar. 11, 1976 in the name of the present applicant. Application Ser. No. 665,864 has now been abandoned and fully supplanted by continuation-in-part application No. 779,302, filed Mar. 21, 1977.

Whatever the type of zero insertion force connector which is adopted in the cabinet of the invention, the object aimed at is, in fact, achieved. Actually, the connector-slides carried by the casing enable the number of outlets of the circuits to be increased while the connector slides carried by the horizontally disposed printed circuit boards, facilitate the wiring operations.

It will be apparent that the extended possibilities of design which are offered by the equipment according to the invention enable numerous electrical connectors, which facilitate the establishment of very numerous outlets for electrical circuits, to be accommodated in the smallest space, and this without using a mechanism requiring great precision, the usual rigid drawer being essentially replaced by a horizontally disposed board guided in two rows of zero insertion force connectors.

Each support may advantageously comprise a single horizontally disposed printed circuit board and a set of board guides each positioned in the same vertical plane as a respective one of the connectors forming the slides carried by the horizontally disposed printed circuit board and adapted to receive the edge of a vertically disposed printed circuit board opposite the edge received by the connector. Each board guide is preferably fixed directly to the associated connector on the horizontally disposed board.

Those casing vertical walls comprising zero insertion force connectors as slides for said horizontally disposed printed circuit boards preferably consist of printed circuit boards.

The invention also includes a printed circuit board for use in a cabinet as defined above, wherein the board is provided on at least one of its faces with a series of parallely-extending zero insertion force connectors.

BRIEF DESCRIPTION OF THE DRAWINGS

The invention will now be described, by way of example, with reference to the accompanying drawings, in which:

FIG. 1, illustrating the prior art, is provided so as to make the novelty and the advantages of the invention more apparent.

DESCRIPTION OF THE PRIOR ART

Figure 1:
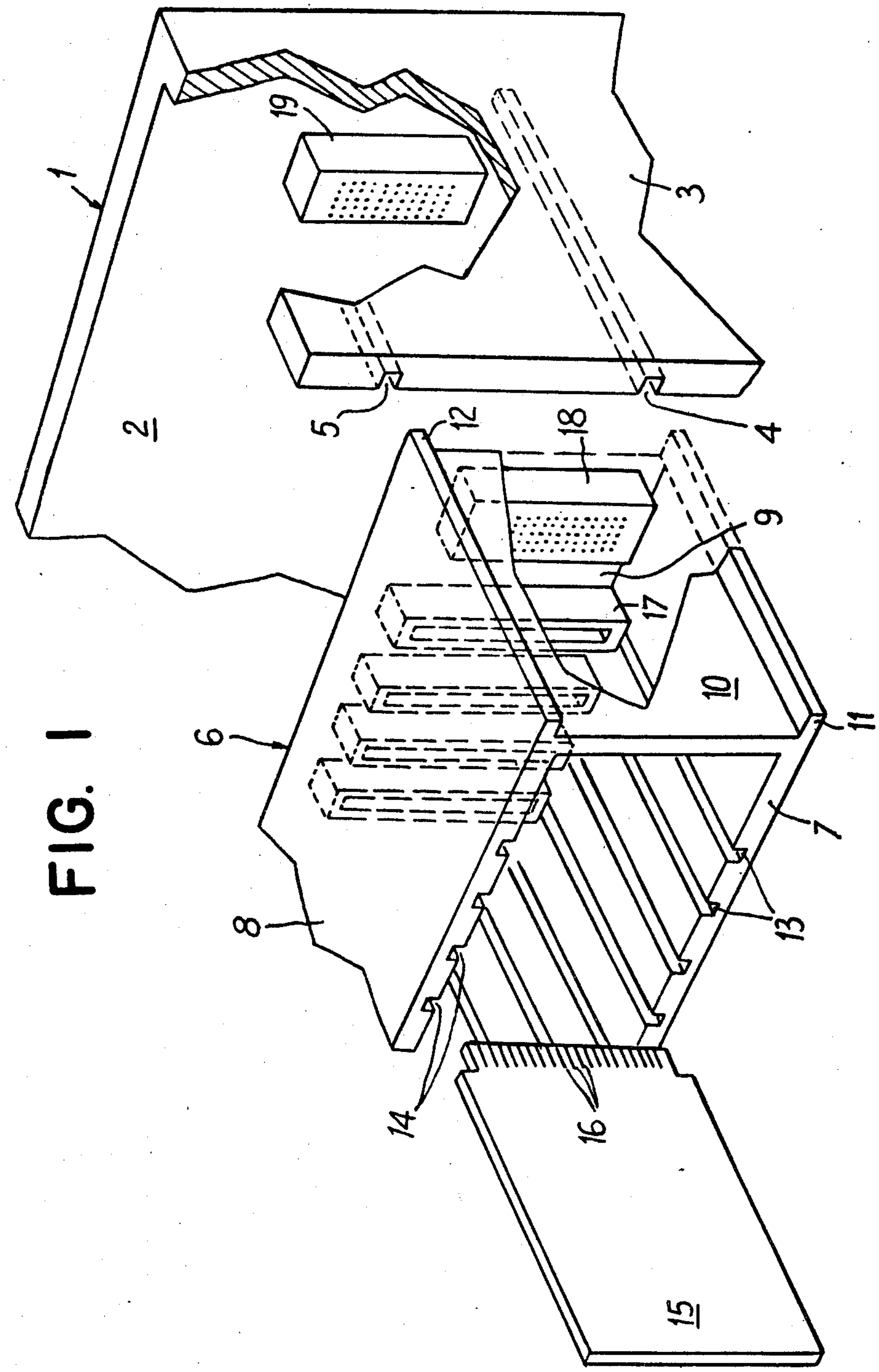
FIG. 1 shows, in exploded perspective view, the essential elements of a prior art wiring cubicle, and illustrates the typical shortcomings of said prior art in order to highlight the novelty and advantages of the present invention more clearly.

According to the known construction shown in FIG. 1, the casing 1 of the cabinet comprises three vertical walls connected at right angles, that is to say a rear wall 2 and two lateral walls 3, only one of which is illustrated. Along each lateral wall 3, the casing 1 carries a plurality of superimposed sets of two horizontal slides, each set comprising a lower slide 4 and an upper slide 5. On the two symmetrical lower slides 4 and on the two symmetrical upper slides 5 there can slide a rigid drawer 6 which generally comprises a horizontal lower wall 7, a horizontal upper wall 8, a vertical transverse wall 9 and two vertical lateral walls 10; these lateral walls 10, only one of which is illustrated, are parallel to the lateral walls 3 of the casing 1. Tongues 11 and 12 project from each vertical lateral wall 10 of the drawer 6 to engage respectively in the slides 4 and 5. The horizontal walls 7 and 8 of the drawer 6 have slides or guide grooves 13 and 14 which open towards one another in pairs in such a manner that each pair of grooves 13 and 14 can receive vertically a printed circuit board 15 which, apart from electrical or electronic components, carries conducting connection tracks 16 only on its rear vertical edge (that is to say the vertical edge first engaged in the grooves 13 and 14). When each board 15 is completely introduced into its drawer 6, its tracks 16 touch resilient contact members (not shown) which belong to a connector 17, the connectors 17 which correspond to the various boards 15 being carried by the vertical transverse wall 9 which constitutes the back of the drawer 6. The contact members of these connectors are connected by wires (not shown) to the terminals of a multiple connector (male or female) 18 which is likewise carried by the vertical transverse wall 9 of the drawer and which cooperates with a matching multiple connector 19. At the height of each drawer 6, the casing 1 carries such a matching connector 19 on its rear vertical wall 2 which constitutes the back of the casing 1.

As it has been described, this known wiring cubicle generally gives satisfaction but its mechanical construction is complicated and it is consequently expensive. Moreover, all the electrical connections emerge solely through the back wall 9 of the drawers 6 and through the back wall 2 of the casing 1; this is why, in many applications, these electrical connections are insufficient in number in relation to the electrical circuits which are contained or could be contained in the printed circuit boards 15.

DESCRIPTION OF PREFERRED EMBODIMENTS

Figure 2:
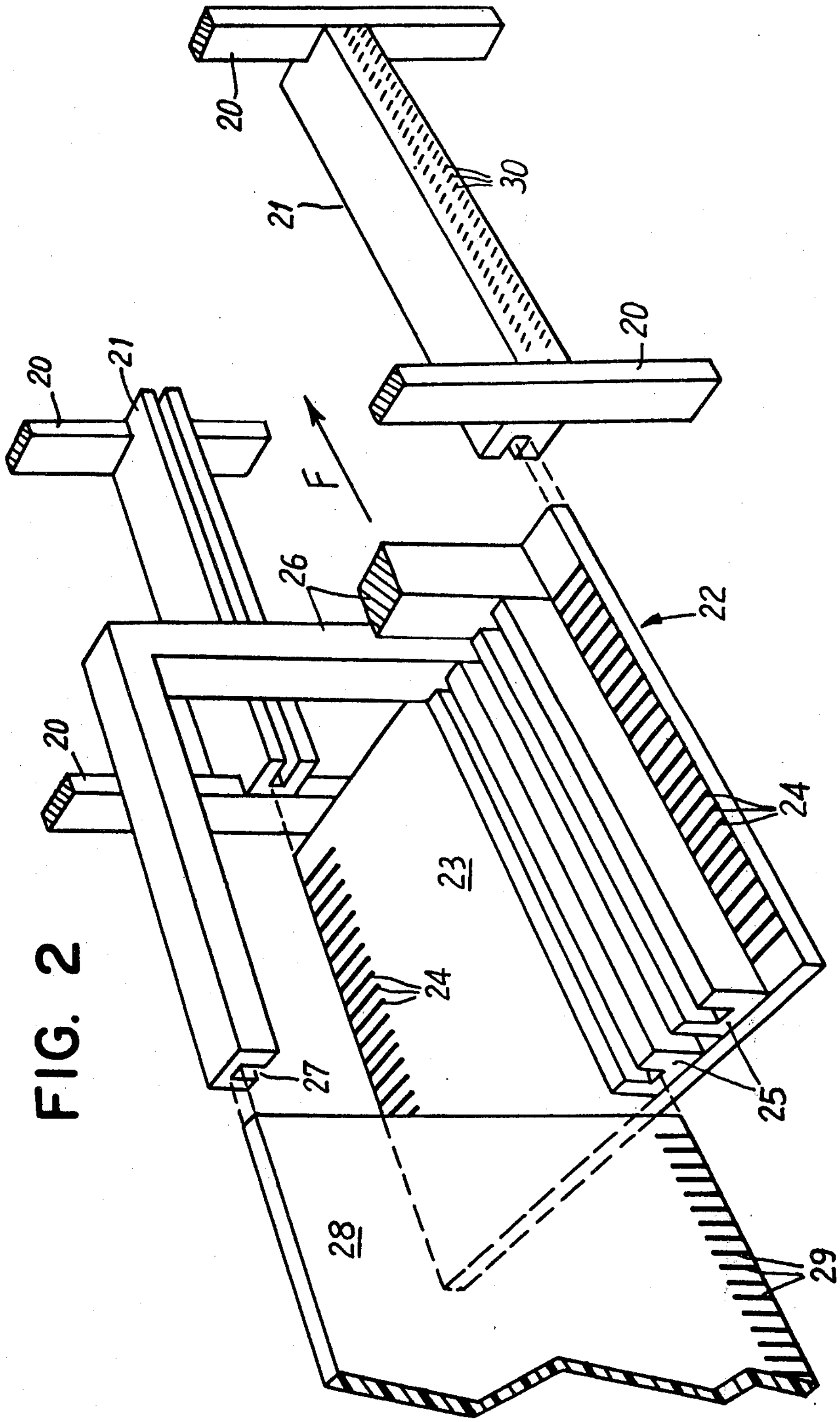
FIG. 2 shows, in a similar manner to FIG. 1, the essential elements of a wiring cubicle which is constructed in accordance with one of the preferred embodiments of the invention.

It is in order to overcome these disadvantages that the wiring cubicle according to the invention has been created, a first preferred embodiment of which is illustrated in FIG. 2.

As shown in FIG. 2, the casing comprises three vertical walls (not illustrated) in the usual manner, which are generally fixed to four uprights 20. Along each of its lateral walls, the casing carries horizontal slides each consisting of one or more aligned zero insertion force connectors 21. These connectors 21 have a U-shaped section and are disposed in pairs at the same height, the connectors of each pair opening towards one another. A support 22, the lower wall of which consists of a horizontally disposed printed circuit board 23 (hereinafter called the "mother board"), can slide on the two connector-slides 21 of each pair. The width of this mother board 23, that is to say its horizontal dimension measured at right angles to the direction of introduction and extraction which is represented by an arrow F, is only slightly less than the distance between the bottoms of the two connectors-slides 21. On its two edges parallel to the direction F, each mother board 23 has connecting tracks 24 which touch the contact members (not shown) of the connector-slides 21 when these contact members are closed on the principle referred to above.

Parallel to the direction F, the mother board 23 carries slides which consist of zero insertion force connectors 25. These connectors 25 have a U-shaped section and their contact members are permanently connected to the printed circuits of that mother board 23 carrying said connectors 25. A board guide 26, in the form of a gallows, is fixed, in the same mean vertical plane as each connector-slide 25, either preferably to this connector-slide 25, or to the mother board 23. On its upper horizontal branch, the board guide 26 has a groove 27 which plays the same part as each groove 14 in FIG. 1. It is thus possible to insert, through the front face of the casing, inside each groove 27 and the subjacent connector-slide 25, a vertically disposed printed circuit board 28 (a "daughter board") which differs from the board 15 of the known apparatus of FIG. 1 in that its connecting conducting tracks 29 are disposed not on its rear edge, but on its lower horizontal edge.

Thus a wiring cubicle is obtained, the mode of assembly of which is as follows. The connector-slides 21 are first mounted by connecting the tails 30 of their contact members to the usual insulated outlets of the wiring cubicle; then, after these contact members have been opened, the complete support 22, that is to say the mother board 23, equipped with the board guides 26 and with the connector-slides 25, the tails of the contact members of which are connected to the lateral tracks 24 of the mother board 23, is introduced as far as it will go, in the direction of the arrow F, after which the said contact members are closed.

Then, after the contact members of the connector-slides 25 have been opened, as many daughter boards 28 as necessary are fully introduced into each of these latter connector-slides, by engaging their horizontal edges in one of the connector-slides 25 and in the groove 27 which is associated with the slides, after which the contact members of these connector-slides 25 are closed.

If it is desired to remove a daughter board 28 to check it or to replace it with another, it is sufficient to open the contact members of the corresponding connector-slide 25 to release it and so permit its extraction in the opposite direction to that of the arrow F.

In a modification (not illustrated) of the described embodiment, each board guide 26 is replaced by an upper connector-slide symmetrical with one of the lower connector-slides 25, and all the upper connector-slides are fixed to a second mother board symmetrical with the mother board 23, the two mother boards then possibly being mechanically connected to one another, for example by means of vertical walls similar to the walls 9, 10 of the known apparatus shown in FIG. 1. In this case, of course, it is necessary to associate with the second mother board (not illustrated), two connector-slides similar to those which are designated by reference numeral 21 and carried at the required height by the casing.

According to the embodiment shown in FIGS. 3 and 4, the casing of the cabinet comprises three vertical walls, that is to say two lateral walls which will be referred to below and a rear wall 31. These vertical walls are generally fixed to four uprights 40. Along each of its lateral walls, the casing carries horizontal slides each consisting of one or more aligned zero insertion force connectors 41. These connectors 41 have a U-shaped section and are disposed in pairs at the same height, the connectors of each pair opening towards one another. There has been represented diagrammatically in FIG. 3 a control member 32, either sliding or rotating, which enables opening and closing all electrical contact members of a connector 41 or of like aligned connectors.

A support which consists of a printed circuit mother board 43 can slide on the connector-slides 41 of each pair. The width of this mother board 43, that is to say its horizontal dimension measured at right angles to the direction of introduction and extraction which is represented by an arrow F in FIG. 3, is only slightly less than the distance between the bottoms of the two connector-slides 41. On its two edges parallel to the direction F, each mother board 43 has connecting tracks (not shown) which touch the contact members (not shown) of connector-slides 41 when these contact members are closed on the principle referred to above.

Parallel to the direction F, each mother board 43 carries slides which consist of zero insertion force connectors 45 the contact members of which are permanently connected to the printed circuits of said mother board 43. The connectors 45 may be provided either on one of the sides only of mother boards 43, as shown in FIG. 3 or as represented on the three lowermost mother boards 43 of FIG. 4, or on both sides of mother boards 43, as represented on the two uppermost mother boards 43 of FIG. 4. These connectors 45 have a U-shaped section and are disposed in pairs in the same vertical plane parallel to direction F, the connectors 45 of each pair opening towards one another. Inside the connectors 45 of such a pair, it is thus possible to insert, from the front face of the casing, a printed circuit daughter board 48 which is provided with conducting tracks for cooperating with the contact members of connectors 45 respectively. At the upper part of FIG. 4, there are shown daughter boards 48 whose lower edges only engage the connectors 45 carried by the underlying mother board 43. In this event the upper edges of these daugher boards are guided by grooves in board guides which may be fixed to said underlying mother board, in the manner disclosed with reference to FIG. 2.

The cabinet which has just been described is thus far similar to that of the preceding embodiment.

According to the embodiment of FIGS. 3 and 4, those vertical lateral walls of the casing which comprise zero insertion force connectors 41 as slides for mother boards 43 consist of printed circuit boards 33 (hereinafter called "grandmother boards"), the contact members of connectors 41 being permanently connected to the printed circuits of said grandmother boards 33. Depending on the height of the casing, each vertical lateral wall of the casing may consist either of one grandmother board 33, or of at least two grandmother boards which are superimposed and electrically connected to each other.

Uprights 40 are provided with securing holes 34 which are spaced a constant distance or "modulus" apart, along the height of these uprights, and each grandmother board 33 is provided with securing holes 35 vertically spaced apart a length equal to this "modulus" or to a multiple thereof, a pin 36 being inserted in each pair of registering holes 34, 35.

The cabinet thus comprises three sets of printed circuit boards:

(1) two vertical grandmother boards 33 provided with printed circuits 37 for making connections between at least two mother boards 43;

(2) two or generally more than two horizontal mother boards 43, provided with printed circuits (in general on both sides) for making connections between at least two daughter boards 48;

(3) a plurality of vertical daughter boards 48, parallel to grandmother boards 33, which daughter boards carry the conventional electric and electronic components (capacitors, resistors, transistors, etc.) on either or both sides.

It is not excluded however that mother boards 43 and grandmother boards 33 also carry some components nor that some daughter boards 48 carry (on either or both sides) connecting printed circuits such as circuits 39, as a complement or a substitute to electric or electronic components.

Figure 3:
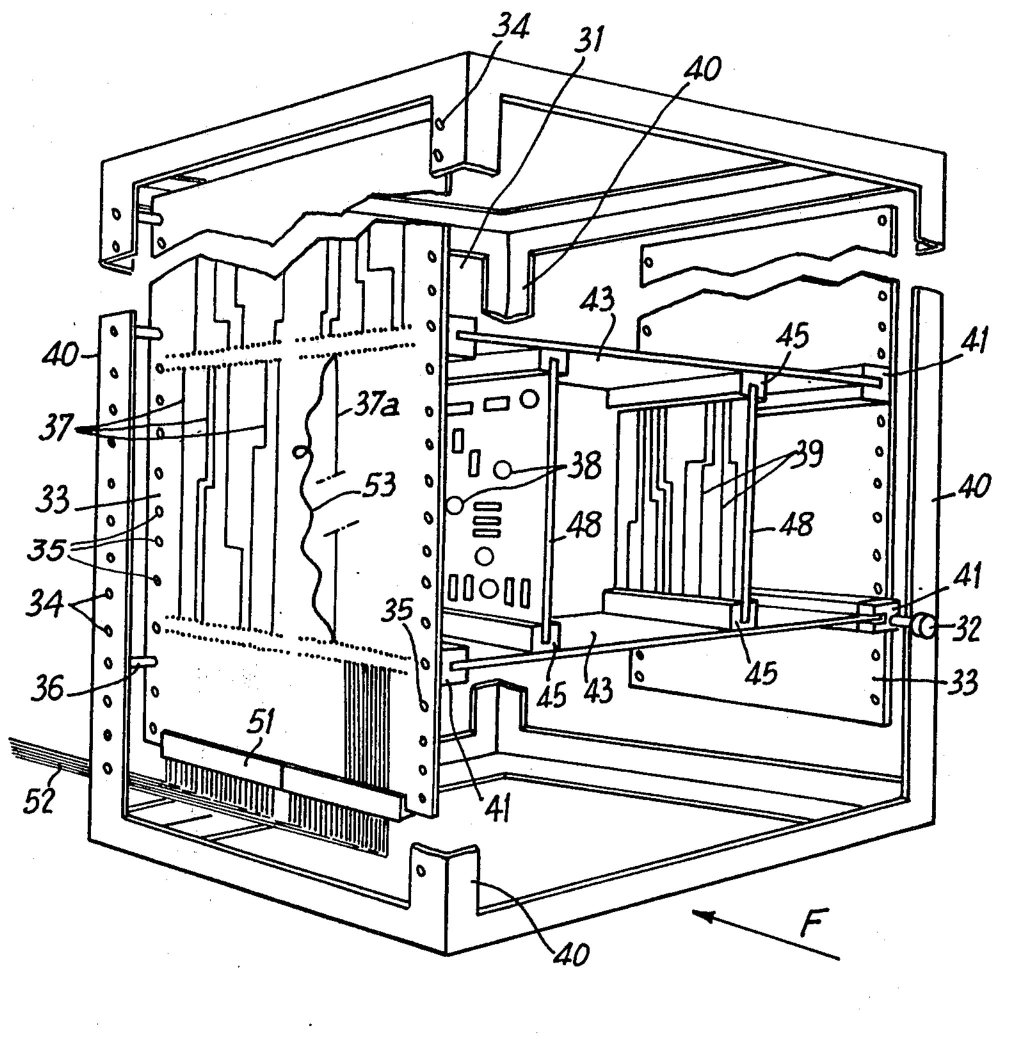
FIG. 3 shows, in perspective view with cutaway portions, the main components of a wiring cubicle which is constructed according to a second preferred embodiment of the invention.
Figure 4:
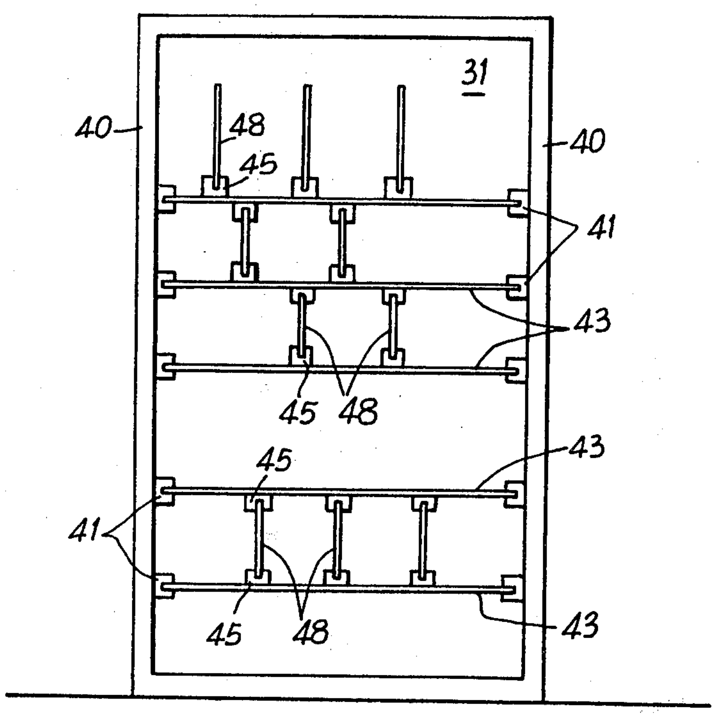

According to the embodiment of FIGS. 3 and 4, it is possible to make in advance all the electrical connections, during the production of the various printed circuit boards 33, 43, 48 by using conventional techniques. There is no difficulty in attaching connectors 41 and 45 respectively to boards 33 and 43 and in piercing holes 35 in boards 33.

As these printed circuit boards and the frame 31, 40 of the cabinet are supplied to the assemblers, they have only to proceed as follows:

fixing the grandmother boards 33 to the frame;

inserting mother boards 43 in connector-slides 45 and closing the contact members of said connector-slides;

connecting feed conductors 52 to one or several connectors 51 provided at the lower portion of grandmother boards 33, these connectors 51 being plain connectors or zero insertion force connectors.

Because of the great number of electrical connections which may be made between the various levels of the cabinet through the printed circuits 37, 39 of grandmother boards 33 and daughter boards 48, simple printed circuit boards can be used instead of, as usual, multilayer boards which are very expensive.

On the other hand the present invention allows:

to dispense with the drawers or baskets of conventional cabinets;

to shorten the electrical path between the various circuits, which is particularly significant for application to computers where the traveling times of electrical pulses are to be taken into account;

to dispense with all the wiring operations proper and consequently to prevent any mistakes being made during such operations;

to permit of changing connections after assembling, either by substituting a modified board to one of boards 33, 43 or by cancelling a printed connection, in particular one of the printed connections 37*a* of a grandmother board 33, and replacing it by a conductor wire 53 which is subsequently soldered to circuits of the board.

Although the present invention has been illustrated and described in connection with a few selected example embodiments, it will be understood that these are illustrative of the invention and are by no means restrictive thereof. It is reasonably to be assumed that those skilled in this art can make numerous revisions and adaptations of the invention and it is intended that such revisions and adaptations will be included within the scope of the following claims as equivalents of the invention.

What is claimed is:

1. A cabinet for electrical or electronic equipment including lateral walls consisting of a first set of printed circuit board, connector means carried by said printed circuit boards forming said lateral walls, a second set of printed circuit boards adapted for endwise insertion within said connector means which form slides for receiving the edges of said second set of printed circuit boards, said connector means providing electrical connections between said second set of printed circuit boards and said first printed circuit boards forming the walls of said cabinet, complementary slides formed on respective ones of said individual printed circuit boards of said second set, a third set of printed circuit boards adapted for insertion or extraction from the complementary slides provided by spaced ones of said second set of printed circuit boards, contact members adapted to engage respective conducting tracks of said printed circuit boards, and means for insuring that such contact members are open during insertion or extraction of said printed circuit boards .

2. The cabinet in accordance with claim 1 including means for mechanically mounting said first set of printed circuit boards to retain said first set of boards in fixed relation to each other.

3. The cabinet construction in accordance with claim 2 wherein each of said slides includes conducting tracks and contact members and means for selectively positioning said contacts in preparation for insertion and removal of the associated printed circuit board by zero insertion and removal force.

4. A cabinet for electrical or electronic equipment, comprising a casing, a plurality of support means, horizontal slides formed within the lateral walls of said casing and for slideably receiving said support means, said support means comprising sets of further slides arranged in pairs, means for opening said contact members during insertion into or extraction from said connector of an associated printed circuit board, said connectors forming the slide being carried by said casing and making electrical contact with conducting tracks formed on the horizontally disposed printed circuit board on the peripheral portions adjacent said lateral edges, said connectors forming the slides on the horizontally disposed printed circuit boards being in turn electrically connected to the conducting tracks on that particular board, and wherein each said board guide is operatively secured to an associated connector in the horizontally disposed printed circuit board.

5. In combination with a cabinet as claimed in claim 4, a printed circuit board having on one of its faces, a series of connectors forming slides adapted each to receive therein the edges of a vertically disposed printed circuit board, and further including a set of board guides, each adapted to receive the opposite edge of one of the vertically disposed boards therein.

6. The cabinet construction in accordance with claim 4 in which at least one of the lateral walls of said casing includes a set of board guides adapted to receive the edges of the horizontally disposed printed circuit board and such wall is constituted by distinct printed circuit board.

7. The cabinet configuration in accordance with claim 4 in which at least two of the vertical walls comprising said casing are constructed of printed circuit boards having complementary board guides positioned in a manner receiving the edges of an associated horizontally disposed printed circuit board, and including zero insertion force means forming slides for said horizontally disposed printed circuit boards.

8. The cabinet construction in accordance with claim 7 including grandmother boards operatively fixed to said frame, means forming connector slides on said vertically disposed grandmother boards, and adapted to receive the complementary edges of horizontally disposed mother boards therein through printed circuit means on said grandmother boards and daughter boards.

9. A cabinet for electrical or electronic equipment, comprising a casing, a plurality of support means, horizontal slides formed within the lateral walls of said casing and for slideably receiving said support means, said support means comprising sets of further slides arranged in pairs, means for opening said contact members during insertion into or extraction from said connector of an associated printed circuit board, said connectors forming the slide being carried by said casing and making electrical contact with conducting tracks formed on the horizontally disposed printed circuit board on the peripheral portions adjacent said lateral edges, said connectors forming the slides on the horizontally disposed printed circuit boards being in turn electrically connected to the conducting tracks on that particular board, and wherein each said board guide is operatively secured to an associated connector in the horizontally disposed printed circuit board, and in which third printed circuit boards form vertical walls of said casing and include zero insertion force connectors forming slides for said horizontally disposed printed circuit boards.

* * * * *